United States Patent [19]

Merchant et al.

[11] Patent Number: 6,118,181
[45] Date of Patent: Sep. 12, 2000

[54] SYSTEM AND METHOD FOR BONDING WAFERS

[75] Inventors: Paul P. Merchant, Belmont; Storrs Hoen, Brisbane, both of Calif.

[73] Assignee: Agilent Technologies, Inc., Palo Alto, Calif.

[21] Appl. No.: 09/124,099

[22] Filed: Jul. 29, 1998

[51] Int. Cl.[7] .................................................. H01L 21/30
[52] U.S. Cl. ........................ 257/757; 257/766; 257/777; 438/455
[58] Field of Search .................................... 438/455, 648, 438/109, 456; 257/750, 754, 766, 777

[56] References Cited

U.S. PATENT DOCUMENTS

| | | | |
|---|---|---|---|
| 4,826,787 | 5/1989 | Muto et al. | 438/455 |
| 5,048,744 | 9/1991 | Chang et al. | 228/123.1 |
| 5,262,347 | 11/1993 | Sands | 438/455 |
| 5,882,992 | 3/1999 | Kobeda et al. | 438/582 |

*Primary Examiner*—Donald L. Monin, Jr.
*Assistant Examiner*—Anh Duy Mai

[57] ABSTRACT

Two wafers are bonded together through an annealing process that maintains temperatures at CMOS compatible levels (i.e., below 500 degrees Celsius). A layer of palladium (Pd) is formed on a first wafer. Preferably an adhesion layer of chromium (Cr) attaches the palladium layer to the first wafer. The palladium layer is engaged with silicon (Si) from a second wafer, and the engaged wafers are annealed to form a palladium-silicide (PdSi) bond between the palladium layer of the first wafer and the silicon of the second wafer. In addition to bonding the first wafer to the second wafer, the palladium-silicon bond may be used to form an electrical connection between the two wafers so that circuits on both wafers may communicate to one another through the palladium-silicon bond.

6 Claims, 4 Drawing Sheets

SYSTEM AND METHOD FOR BONDING WAFERS

CROSS REFERENCE TO RELATED APPLICATIONS

This document is related to copending U.S. Patent Application entitled SYSTEM AND METHOD FOR FORMING ELECTROSTATICALLY ACTUATED DATA STORAGE MECHANISMS, assigned serial number (to be determined), and filed by Merchant et al. on (to be determined), and to copending U.S. Patent Application entitled SYSTEM AND METHOD FOR BONDING AND SEALING MICROFABRICATED WAFERS TO FORM A SINGLE MONOLITHIC STRUCTURE HAVING A VACUUM CHAMBER THEREIN, assigned serial number (to be determined) and filed by Merchant et al. on (to be determined), which are both incorporated herein by reference.

BACKGROUND OF THE INVENTION

1. Field of the Invention

The present invention generally relates to microfabrication and, in particular, to a system and method for bonding wafers. The present invention is particularly suited for bonding wafers that include circuitry, such as complementary metal-oxide semiconductor (CMOS) circuits.

2. Related Art

As known in the art, there are many situations when it is desirable to use wafer bonding via microfabrication techniques to efficiently manufacture micromachined structures. Furthermore, in many applications, it is also desirable for the bonded wafers to include complementary metal-oxide semiconductor (CMOS) circuitry. However, most conventional wafer bonding processes are not suitable for bonding wafers that include CMOS circuitry and other temperature sensitive components because the relatively high temperatures associated with the bonding process can damage the CMOS circuitry or other temperature sensitive components. In particular, CMOS circuitry can be damaged when exposed to temperatures at or above approximately 500 degrees Celsius. In order to ensure that CMOS circuitry and/or other components are not damaged, it is desirable to bond wafers with temperatures less than or equal to approximately 450 degrees Celsius.

The conventional bonding processes of fusion and oxide diffusive bonding are usually unacceptable for bonding wafers that include CMOS circuitry because these processes typically form bonds with temperatures far above 500 degrees Celsius. Furthermore, any conventional bonding process creating electric fields, such as anodic bonding, is undesirable because the electric fields may break down junctions or gate oxides in the CMOS components. In addition, it is often undesirable to use eutectic bonding in order to bond two wafers together because the existence of liquid phases in these processes can sometimes lead to rapid dissolution of underlayers and, hence, a loss of process control. Furthermore, maintaining precise separation distances between two wafers bonded via eutectic bonding can be difficult since the surfaces of the eutectics typically deform when a temperature close to the eutectic's melting point is reached. Also, organic bonding does not typically provide electrical contacts or good thermal bonds.

Because of the foregoing, conventional bonding processes are not suitable for bonding wafers having CMOS circuitry (or other components sensitive to temperatures above approximately 500 degrees Celsius) unless additional steps are taken to protect the CMOS circuitry and/or other temperature sensitive components. Thus, a previously unaddressed need exists in the industry for providing a system and method of efficiently bonding wafers with CMOS compatible microfabrication techniques.

SUMMARY OF THE INVENTION

The present invention overcomes the inadequacies and deficiencies of the prior art as discussed herein. The present invention provides a system and method for bonding two wafers together at relatively low temperatures. One of the wafers preferably includes a silicon (Si) layer on its outer surface, and the other wafer preferably includes a layer of palladium (Pd) on its outer surface. The silicon layer and the palladium layer are engaged and annealed at temperatures compatible with CMOS circuitry. Therefore, either of the two wafers may include CMOS components or other components sensitive to temperatures above approximately 500 degrees Celsius during the bonding process.

In accordance with another feature of the present invention, the palladium-silicon (Pd—Si) bond formed during the annealing process provides an electrical connection between the two wafers. Therefore, any circuits included in the first wafer may communicate with any circuit included in the second wafer through the palladium-silicon bond.

The present invention can also be viewed as providing a method for bonding one wafer to another wafer at CMOS compatible temperatures. Briefly described, the method can be broadly conceptualized by the following steps: forming a palladium layer on a first wafer; engaging the palladium layer with silicon included within a second wafer; and annealing the first and second wafer to form a bond between the silicon and the palladium layer.

The present invention has many advantages, a few of which are delineated below, as mere examples.

An advantage of the present invention is that a silicon wafer can be bonded to another wafer at relatively low temperatures.

Another advantage of the present invention is that wafers having components sensitive to relatively high temperatures, such as CMOS circuitry, may be bonded together without damaging the temperature sensitive components.

Another advantage of the present invention is that a bond formed between two wafers can be used as an electrical connection between the two wafers. Therefore, circuitry on one of the wafers may communicate to circuits on the other wafer.

Another advantage of the present invention is that an efficient bonding process is realized. Separate steps for providing a mechanical and an electrical bond between two wafers are not necessary.

Other features and advantages of the present invention will become apparent to one skilled in the art upon examination of the following detailed description, when read in conjunction with the accompanying drawings. It is intended that all such features and advantages be included herein within the scope of the present invention, as is defined by the claims.

BRIEF DESCRIPTION OF THE DRAWINGS

The invention can be better understood with reference to the following drawings. The elements of the drawings are not necessarily to scale relative to each other, emphasis instead being placed upon clearly illustrating the invention. Furthermore, like reference numerals designate corresponding parts throughout the several views.

DETAILED DESCRIPTION OF THE INVENTION

The present invention provides a system and method for bonding wafers. Due to the low temperatures utilized, thermal stresses are minimized during the bonding of the wafers. Accordingly, adverse effects due to high thermal stresses, such as bowing for example, can be prevented or minimized. Furthermore, the wafers can be bonded together in accordance with the present invention without damaging CMOS circuitry or other temperature sensitive components included within the wafers. Since non-CMOS components can also be included in the wafers, references herein to "CMOS components" or "CMOS circuitry" shall include CMOS components and other types of components sensitive to temperatures above approximately 500 degrees Celsius. In addition, "CMOS compatible" shall refer to a process or a system that prevents damage to CMOS components or other adverse effects from occurring due to exposure to temperatures above approximately 500 degrees Celsius.

In the preferred embodiment of the present invention, at least one of the wafers, the bonding wafer, has a silicon surface. The silicon surface is preferably bonded to a surface of the other wafer, the handle wafer, to form a silicide. The use of a silicide as the bonding material results in a mechanically strong metallic interface between the two wafers. Furthermore, the silicide provides a good electrical and thermal contact between the bonded materials of the two wafers, and the suicide also has a good thermal expansion match to silicon which helps to maintain low wafer warpage in the preferred embodiment.

A silicon (Si) layer of the bonded wafer is preferably bonded to a palladium (Pd) layer of the handle wafer to form a bond between the two wafers. The bond between the palladium layer and the silicon layer can be formed with a low formation temperature, thereby allowing either of the two wafers to include CMOS circuitry during the bonding process.

Figure 1A:
FIGS. 1A and 1B are side views of two wafers being bonded together in accordance with the invention.
Figure 1A:
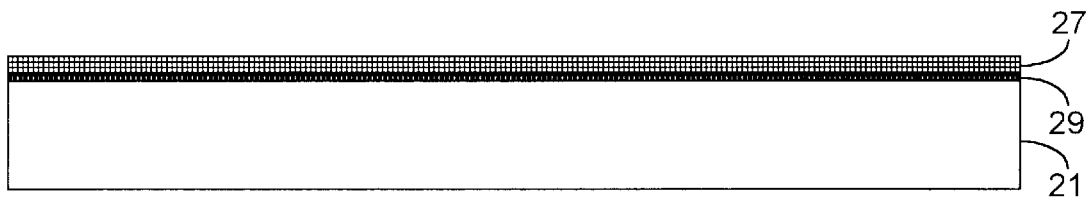
Figure 1B:
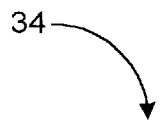
Figure 1B:
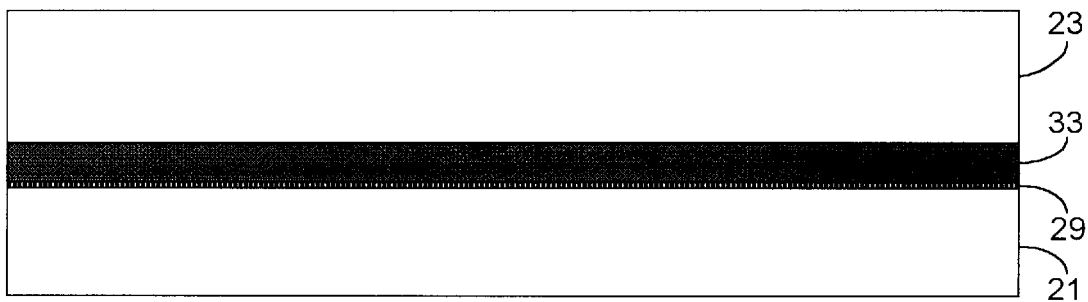

FIGS. 1A and 1B are illustrations depicting two wafers 21 and 23 being bonded together. As known in the art, the wafers 21 and 23 depicted in FIGS. 1A and 1B may include other layers and/or circuitry not shown for simplicity in order to implement other various functionalities. In the preferred embodiment, the handle wafer 21 is attached to a layer of palladium 27 via an adhesive layer 29 of chromium (Cr). Although other thicknesses are possible, the layer of chromium is preferably 200 to 250 Angstroms, and the layer of palladium is preferably 1000 to 2000 Angstroms. Furthermore, other elements for the layer 29 are possible. For example, titanium (Ti) or other suitable elements may be used in place of the chromium.

The bonding wafer 23 may be of any suitable configuration as long as the bonding materials can be bonded at CMOS compatible temperatures in applications where either wafer 21 or 23 or both wafers 21 and 23 include CMOS components. In the preferred embodiment, the bonding wafer 23 is designed to include a silicon layer 31, formed on an outer surface of the bonding wafer 23, as depicted by FIG. 1A.

The silicon layer 31 is configured to engage the palladium layer 27. When the silicon layer 31 and the palladium layer 27 are engaged and are annealed, the two layers 27 and 31 are designed to form a palladium-silicide (PdSi) layer or bond 33 as depicted in FIG. 1B. The palladium-silicide bond 33 forms a bond between wafers 21 and 23 such that the wafers 21 and 23 form a single structure 34.

The annealing or bonding process for forming the palladium-silicon bond 33, which will be described in more detail below, is designed to bond the silicon layer 31 with the palladium layer 27 only with temperatures at or below approximately 450 degrees Celsius. By keeping temperatures of the bonding process below approximately 450 degrees Celsius, any CMOS circuitry included in either of the wafers 21 or 23 should not be damaged. Furthermore, since the palladium-silicon bond 33 is capable of conducting current, the palladium-silicon bond 33 can be used as an electrical connection between any circuitry included within wafer 23 and any circuitry included within wafer 21.

It should be noted that other elements may be used in combination with or in place of the palladium in layer 27. For example, it may be possible to use platinum instead of palladium for the layer 27. However, during experiments, temperatures of greater than 500 degrees Celsius were required to produce a reliable bond when platinum was used in place of the palladium in layer 27. Since palladium has experimentally been found to enable a lower bonding temperature, palladium is preferable to platinum, but in some embodiments, it may be possible to use platinum or other materials for the palladium layer 27.

It should be further noted that the adhesion of palladium to chromium has been found to depend directly on the cleanliness of the chromium layer 29 surface. Therefore, it is preferable to perform a brief (i.e., approximately 1 to 2 minutes) 150 W rf sputter-etch cleaning of the chromium layer 29 surface just prior to application of the palladium layer 27 to the chromium layer 29.

Fabrication Methodology

The structure 34 is preferably mirofabricated according to the preferred fabrication methodology and use of the present invention described below. To better illustrate the invention, the fabrication and use of the present invention will be discussed with reference to FIGS. 2A–2E and FIG. 3.

Figure 2A:
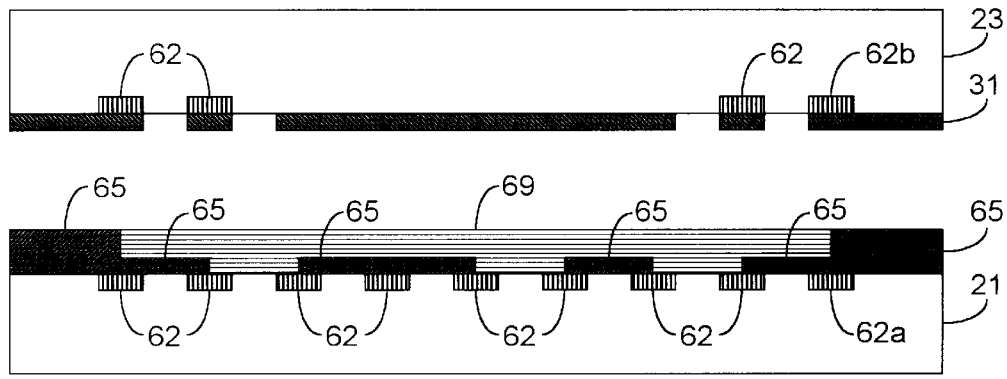
FIGS. 2A–2E are side views of two wafers having CMOS circuitry that are being bonded together in accordance with the invention.

Initially, the wafers 21 and 23 depicted in FIG. 2A are formed by microfabrication techniques or other suitable techniques known in the art. Although other configurations are possible, wafers 21 and 23 preferably include circuitry 62, such as CMOS circuitry, for example, and wafer 21 preferably includes electrodes 65 connected to various portions of the circuitry 62 as depicted in FIG. 2A. The electrodes 65 form electrical connections between the circuitry 62 of wafer 21. Wafer 21 may also include an insulating region 69 in order to provide electrical separation between the circuitry 62, if desired. The insulating region 69 may be comprised of any suitable insulating material known in the art.

Wafer 23 preferably includes a silicon layer 31 on the outside surface of wafer 23. Silicon layer 31 may be formed on wafer 23 through deposition or any other type of formation process. In order to provide electrical isolation between the circuitry 62 on wafer 23, the silicon layer 31 may be patterned, as depicted by FIGS. 2A–2E, for example. In this regard, the patterning of silicon layer 31, as depicted by FIG. 2A, electrically isolates circuitry 62b from the other circuitry 62 included on wafer 23, assuming that the wafer 23 is non-conductive.

Figure 2B:
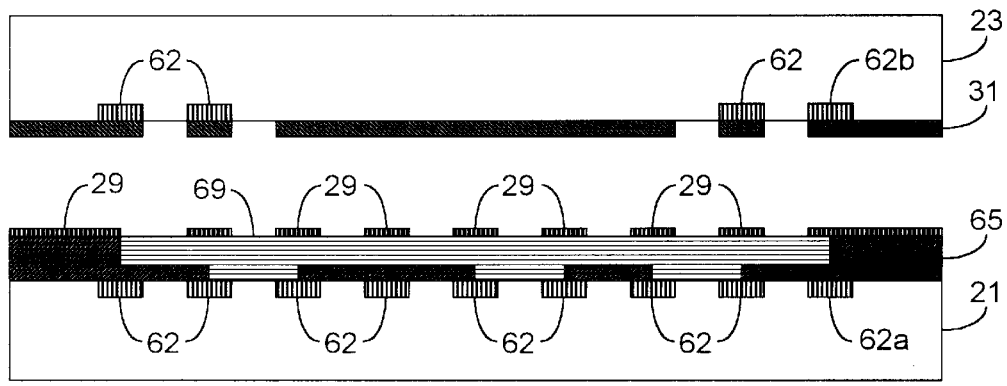
Figure 2C:
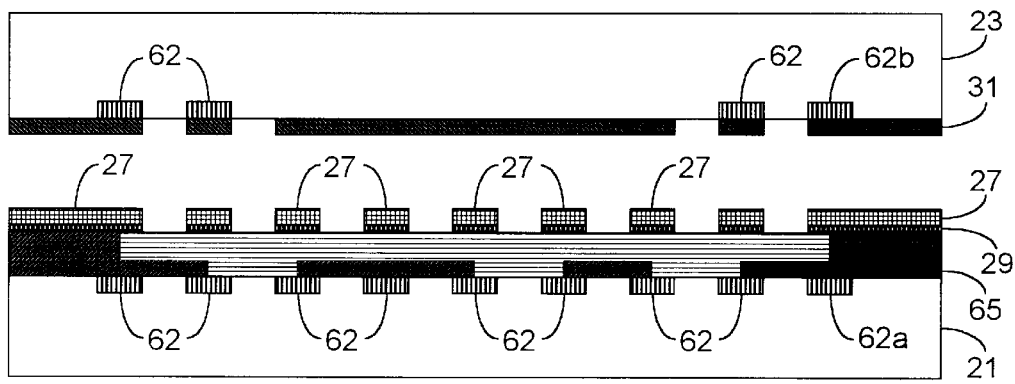
Figure 3:
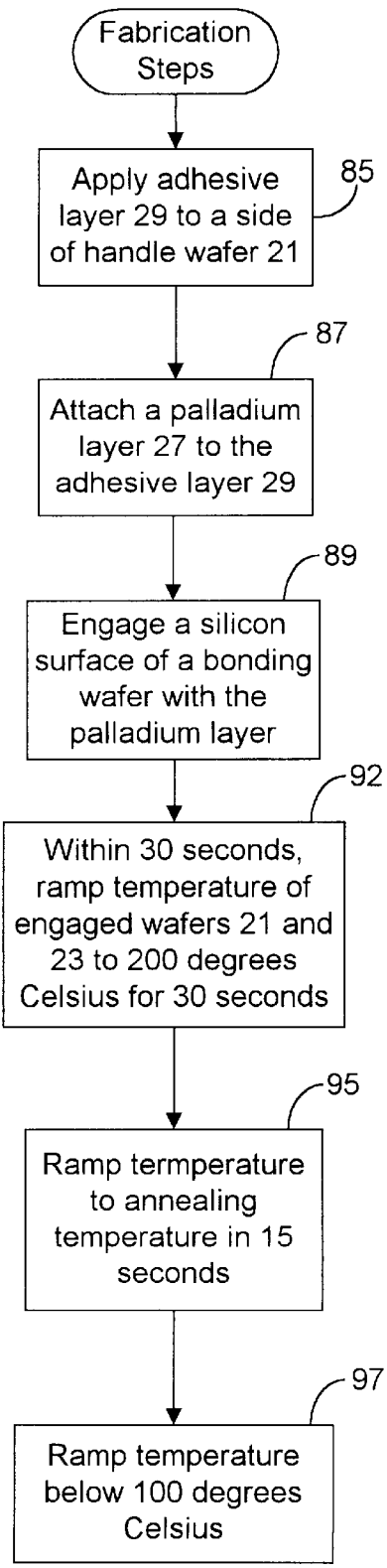
FIG. 3 is a flow chart illustrating the bonding process depicted by FIGS. 2A–2E.

As depicted by FIG. 2B and block 85 of FIG. 3, an adhesive layer 29, preferably comprised of chromium, is formed or deposited on wafer 21 through techniques known in the art. Although not necessary for implementation of the present invention, the adhesive layer 29 may be patterned, through known techniques such as masking or other suitable techniques, so that the patterning of the adhesive layer 29 coincides with a subsequent formation of the palladium layer 27, as depicted by FIG. 2C. As previously mentioned, although chromium forms adhesive layer 29 in the preferred embodiment, other elements or mixtures of elements are also possible.

As depicted in FIG. 2C and block 87 of FIG. 3, a palladium layer 27 is formed or deposited on the adhesive layer 29. Prior to forming the palladium layer 27, it is desirable to perform a brief (1 to 2 minute) 150 W rf sputter-etch cleaning of the chromium layer 29 surface.

The adhesive layer 29 attaches the palladium layer 27 to wafer 21. Although not necessary for the implementation of the present invention, the palladium layer 27 and the adhesive layer 29 may be patterned as depicted by FIG. 2C through known techniques to provide electrical and/or mechanical isolation between different portions of the adhesive layer 29, if desired.

Figure 2D:
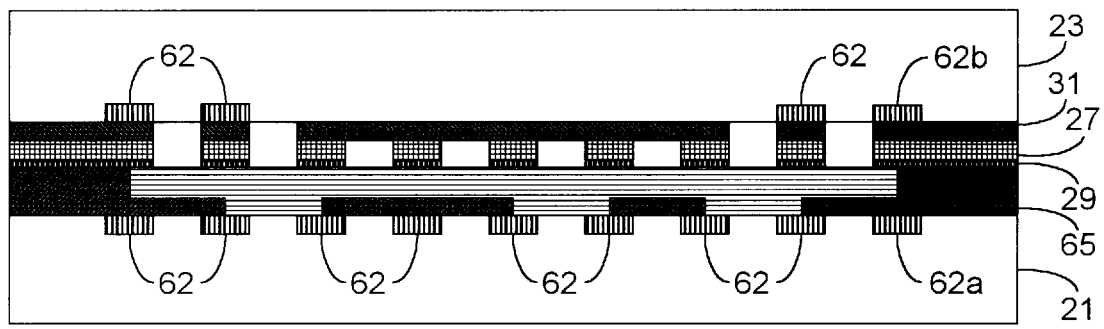

Referring to FIG. 2D and block 89 of FIG. 3, wafer 21 is then engaged with the silicon layer 31 of wafer 23. Although other pressures are also possible, the two wafers 21 and 23 are preferably pressed together at a pressure of approximately 10 to 14 KPA (1.5 to 2 psi) to form a weak bond between the palladium layer 27 and the silicon layer 31. Although not necessary for implementing the invention, the silicon layer 31 of wafer 23, before implementation of block 89, is preferably sprayed with a 10:1 deionized water/HF solution (10 parts deionized water and 1 part HF solution) for about one minute and then is preferably blown dry with nitrogen to clean the surface of the wafer 23.

Figure 2E:
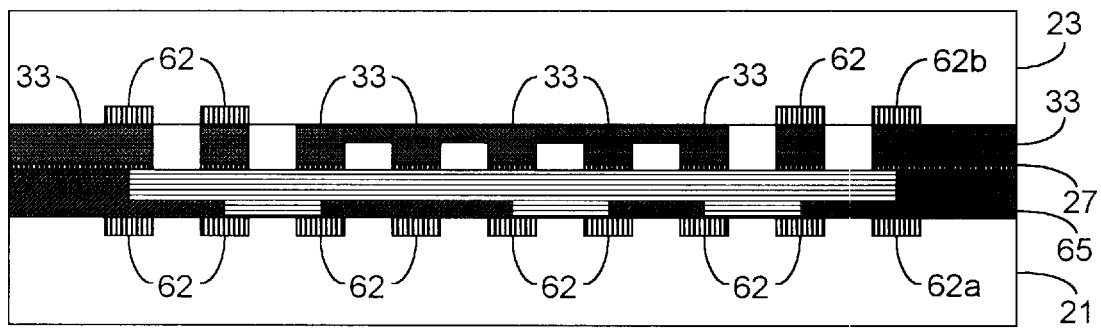

The wafers 21 and 23 are then placed in an annealing chamber. A bonding process is then performed on the structure 34 by varying the temperature within the annealing chamber according to blocks 92–97 of FIG. 3 in order to form a palladium-silicon bond 33 between wafer 21 and wafer 23, as depicted by FIG. 2E. In this regard, the temperature of the annealing chamber is preferably increased to approximately 200 degrees Celsius within about 30 seconds once the wafers 21 and 23 are placed in the annealing chamber, as shown by block 92 of FIG. 3. Although not necessary for implementing the invention, it is preferable to change the temperature linearly (i.e., "ramp" the temperature) when the temperature of the annealing chamber is being varied.

As shown by blocks 92 and 95, the temperature is preferably held at approximately 200 degrees Celsius for about 30 seconds and then increased to the annealing temperature in about 15 seconds. Experiments have shown that annealing temperatures and durations sufficient for implementing the invention are approximately 450 degrees Celsius for about 30 minutes, approximately 400 degrees Celsius for about 30 minutes, or approximately 300 degrees Celsius for about 45 minutes. It should be noted that other annealing temperatures and durations are possible for forming a sufficient bond 33 between wafers 21 and 23. A bond is "sufficient" for the purposes of the present invention when it is capable of maintaining an alignment of wafer 21 with respect to wafer 23 during normal operation of the structure 34

After maintaining the annealing temperature for the prescribed time, the temperature of the annealing chamber is decreased below approximately 100 degrees Celsius in about six minutes, as shown by block 97. At this point, a palladium-silicon bond 33 should be sufficient to keep wafer 21 attached and aligned to wafer 23. One skilled in the art should realize that other temperatures and times are possible for the bonding process depicted by FIG. 3. However, the strength and/or durability of the bond 33 may be affected if different temperatures or times are utilized.

It should be noted that the silicon layer 31 and the palladium layer 27 are not necessarily pure silicon and pure palladium, respectively. Although the preferred embodiment utilizes pure elements of silicon and palladium, one ordinarily skilled in the art should realize that other elements can be added or combined with the silicon layer 31 and/or the palladium layer 27. Furthermore, it is possible to substitute entirely for the silicon and/or the palladium with other suitable materials. However, one skilled in the art should realize that substituting for the silicon and/or palladium may affect the temperatures associated with the bonding process. In addition, substituting elements for the chromium in adhesive layer 29 may also affect the temperatures associated with the bonding process.

It should be further noted that other materials may be used to provide an electrical connection between the two wafers 21 and 23. For example, portions of the layers 27 and 31 can be replaced with other conductive material. In this regard, the bonding of the silicon and palladium included within the layers 27 and 31 provides the structure 34 with mechanical support, and the other conductive material provides an electrical connection between the circuitry of wafer 21 and the circuitry of wafer 23.

Furthermore, since relatively low temperatures are used to bond the palladium layer 27 and the silicon layer 3 1, a bond 33 is formed between wafers 21 and 23 without melting the palladium layer 27 and the silicon layer 31. This facilitates attempts to form and maintain precise separation distances between the two wafers 21 and 23 because the palladium layer 27 and the silicon layer 31 both remain relatively rigid. If the temperature of the bonding process caused either of the layers 27 or 31 to melt (or come close to melting), the layers 27 and/or 31 would be likely to deform, thereby frustrating attempts to form and maintain precise separation between the two wafers 21 and 23.

In concluding the detailed description, it should be noted that it will be obvious to those skilled in the art that many variations and modifications may be made to the preferred embodiment without substantially departing from the invention. All such variations and modifications are intended to be included herein within the scope of the present invention, as set forth in the following claims.

What is claimed is:

1. A micromachined system, comprising:
   a first wafer having a contact consisting essentially of palladium and an adhesive layer consisting essentially of chromium, said chromium attached directly to said palladium; and
   a second wafer having silicon on at least one surface, said silicon bonded with said palladium to form a bond between said first wafer and said second wafer.

2. The system of claim 1, wherein said first and second wafers include complementary metal-oxide semiconductor (CMOS) circuitry and said bond forms an electrical connection between said CMOS circuitry of said first wafer and said CMOS circuitry of said second wafer.

3. The system of claim 1, wherein said bond is formed at temperatures less than 500 degrees Celsius.

4. A system, comprising:

a first micromachined wafer having a first layer consisting essentially of palladium and an adhesive layer consisting essentially of chromium, said first layer attached directly to said adhesive layer and a second micromachined wafer having a second layer including silicon, said second layer configured to engage said first layer and to form a bond between said first layer and said second layer when said layers are heated to a bonding temperature, wherein said bond between said first layer and said second layer is sufficient to maintain an alignment of said first wafer with respect to said second wafer and wherein said bond is configured to form an electrical connection between circuitry contained in said first wafer and circuitry contained in said second wafer.

5. The system of claim 4, wherein said circuitry contained in said first wafer and said circuitry contained in said second wafer are both complementary metal-oxide semiconductor (CMOS) circuitry.

6. The system of claim 4, wherein said bond between said first layer and said second layer is formed at temperatures less than 500 degrees Celsius.

* * * * *